(12) United States Patent  
Heo et al.

(10) Patent No.: US 7,888,674 B2  
(45) Date of Patent: Feb. 15, 2011

(54) THIN-FILM TRANSISTOR SUBSTRATE AND METHOD OF MANUFACTURING THE SAME

(75) Inventors: Seong-Kweon Heo, Suwon-si (KR); Chun-Gi You, Hwaseoung-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/605,647

(22) Filed: Oct. 26, 2009

(65) Prior Publication Data

US 2010/0044712 A1 Feb. 25, 2010

Related U.S. Application Data

(62) Division of application No. 11/944,010, filed on Nov. 21, 2007, now Pat. No. 7,608,493.

(30) Foreign Application Priority Data

Dec. 11, 2006 (KR) ...................... 10-2006-0125231

(51) Int. Cl.  
*H01L 29/04* (2006.01)
(52) U.S. Cl. ............................. 257/57; 257/59; 257/72; 257/E21.414
(58) Field of Classification Search .................. 257/57, 257/59, 72, 379, E21.414; 438/30, 155  
See application file for complete search history.

(56) References Cited

U.S. PATENT DOCUMENTS

| 6,038,003 | A | * | 3/2000 | Kim ............................. 349/43 |
| 6,674,495 | B1 | * | 1/2004 | Hong et al. .................... 349/43 |
| 7,112,512 | B2 | | 9/2006 | Lan |
| 7,351,623 | B2 | | 4/2008 | Ahn |
| 7,563,627 | B2 | * | 7/2009 | Cho et al. ...................... 438/30 |
| 7,580,088 | B2 | * | 8/2009 | Kim et al. ..................... 349/43 |
| 2007/0262347 | A1 | | 11/2007 | You |

OTHER PUBLICATIONS

Notice of Allowance dated Jun. 17, 2009 (for co-pending U.S. Appl. No. 11/944,010).

* cited by examiner

*Primary Examiner*—Michael Trinh  
(74) *Attorney, Agent, or Firm*—H.C. Park & Associates, PLC

(57) ABSTRACT

A thin-film transistor substrate includes a gate line, a capacitor dielectric layer, a gate insulation layer, an active pattern, a data line, a protection layer, and a pixel electrode. The gate wiring including a gate electrode, a lower storage electrode, and a gate metal pad is disposed on a substrate. The capacitor dielectric layer is disposed on the lower storage electrode and the gate insulation layer is disposed on the substrate. The active pattern includes an active layer and a dummy active layer disposed on the gate insulation layer in a gate electrode region and a gate metal pad region, respectively. A portion of the upper storage electrode is disposed on the capacitor dielectric layer exposed through a first contact hole in the gate insulation layer.

5 Claims, 15 Drawing Sheets

THIN-FILM TRANSISTOR SUBSTRATE AND METHOD OF MANUFACTURING THE SAME

CROSS-REFERENCE TO RELATED APPLICATION

This application is a divisional of U.S. patent application Ser. No. 11/944,010, filed on Nov. 21, 2007, U.S. Pat. No. 7,608,493, and claims priority from and the benefit of Korean Patent Application No. 10-2006-0125231, filed on Dec. 11, 2006, which are hereby incorporated by reference for all purposes as if fully set forth herein.

BACKGROUND OF THE INVENTION

1. Field of the Invention

The present invention relates to a thin-film transistor (TFT) substrate. More particularly, the present invention relates to a TFT substrate and a method of manufacturing the TFT substrate.

2. Discussion of the Background

A liquid crystal display (LCD) apparatus includes a thin-film transistor (TFT) substrate, a color filter substrate facing the TFT substrate, and a liquid crystal layer disposed between the TFT substrate and the color filter substrate.

The TFT substrate has a plurality of pixels, each of which includes a TFT section and storage capacitor section, so that each pixel may be independently driven.

In a display apparatus for a mobile electronic apparatus, enhancing the aperture ratio becomes very important because the display apparatus should have high resolution within a relatively small area. The most important factors for the aperture ratio include the area of the storage capacitor section and the adoption of fine lines.

In order to reduce the area of the storage capacitor section, the thickness of a gate insulation layer may be reduced or the gate insulation layer may have a double-layered structure of silicon oxide ($SiO_2$) and silicon nitride ($SiN_x$).

However, when the thickness of a gate insulation layer is excessively reduced, the gate insulation layer may become unreliable and vulnerable to electrostatic charges. When the gate insulation layer has the double-layered structure of $SiO_2$ and $SiN_x$, $SiO_2$ may remain under a channel of a TFT and therefore, may deteriorate the TFT even though the capacitance of the storage capacitor section increases.

SUMMARY OF THE INVENTION

The present invention provides a thin-film transistor (TFT) substrate that may be capable of enhancing an aperture ratio without deteriorating the TFT.

The present invention also provides a method of manufacturing the TFT substrate.

Additional features of the invention will be set forth in the description which follows, and in part will be apparent from the description, or may be learned by practice of the invention.

The present invention discloses a TFT substrate including a gate wiring, a capacitor dielectric layer, a gate insulation layer, an active pattern, a data wiring, a protection layer, and a pixel electrode. The gate wiring is disposed on the substrate. The gate wiring includes a gate electrode, a lower storage electrode, and a gate metal pad. The capacitor dielectric layer is disposed on the lower storage electrode. The gate insulation layer is disposed on the substrate. The active pattern includes an active layer and a dummy active layer disposed on the gate insulation layer in a gate electrode region and a gate metal pad region, respectively. The data wiring includes a source electrode, a drain electrode, an upper storage electrode, and a data metal pad. The source and drain electrodes are disposed on the active layer such that the source and drain electrodes are spaced apart from each other. A portion of the upper storage electrode is disposed on the capacitor dielectric layer exposed through a first contact hole in the gate insulation layer. The data metal pad is directly connected to the gate metal pad through a second contact hole in the gate insulation layer and the dummy active layer. The protection layer is disposed on the substrate. The pixel electrode is disposed on the protection layer and connected to the drain electrode.

The present invention also discloses a method of manufacturing a TFT substrate including forming a gate wiring and a capacitor dielectric layer through a patterning process using one mask. The gate wiring including a gate electrode and a lower storage electrode is formed on a substrate. The capacitor dielectric layer is formed on the lower storage electrode. A gate insulation layer and an active layer are formed on the substrate. The gate insulation layer has a first contact hole in a capacitor dielectric layer region. The active layer is formed on the gate insulation layer to cover the gate electrode. A data wiring including a source electrode, a drain electrode, and an upper storage electrode is formed. The source and drain electrodes are disposed on the active layer such that the source and drain electrodes are spaced apart from each other. A portion of the upper storage electrode is disposed on the capacitor dielectric layer exposed through the first contact hole. A protection layer is formed on the substrate and then, a pixel electrode is formed on the protection layer. The pixel electrode is connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
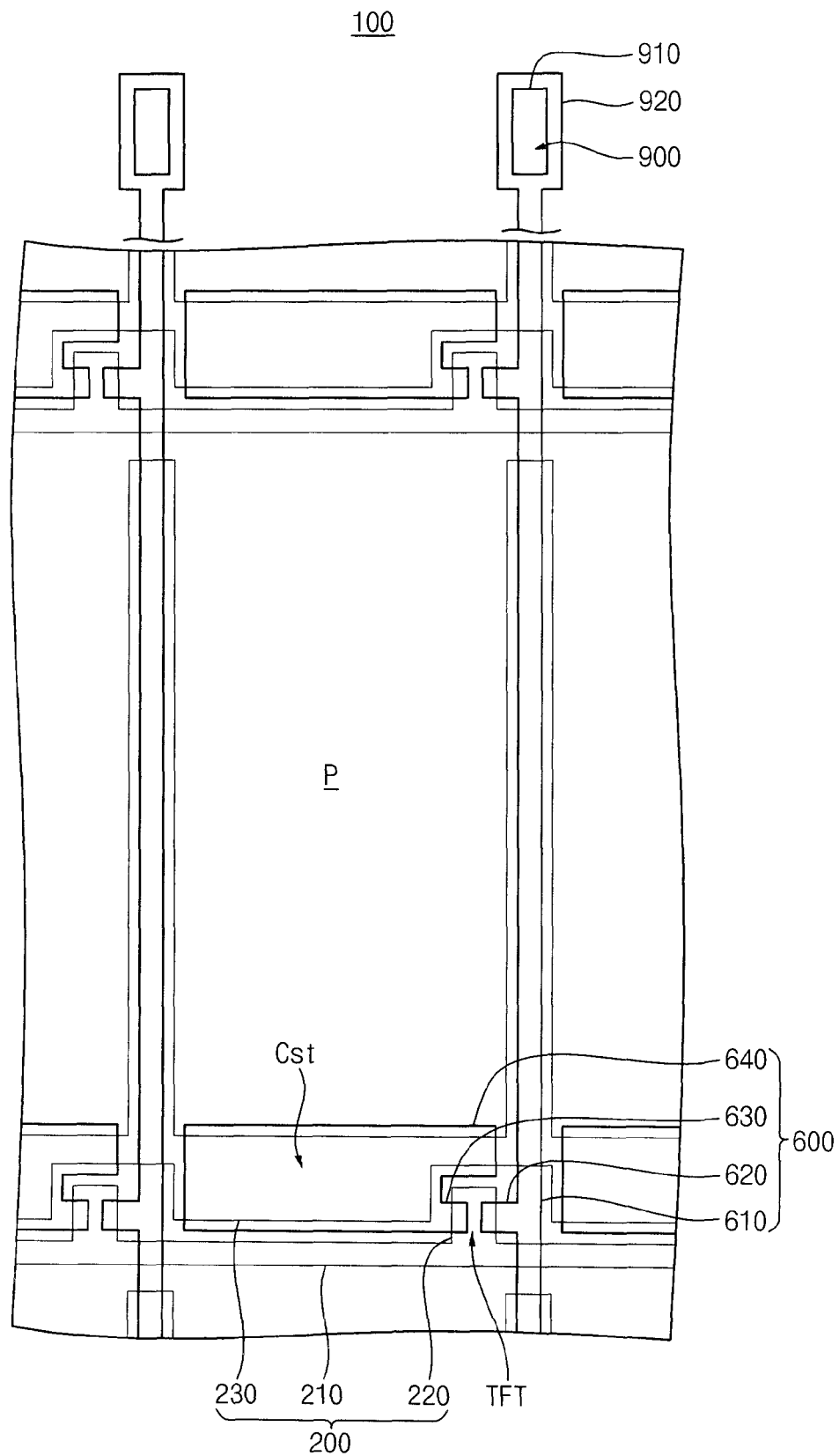
FIG. 1 is a layout showing a portion of a thin-film transistor (TFT) substrate according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

Figure 2:
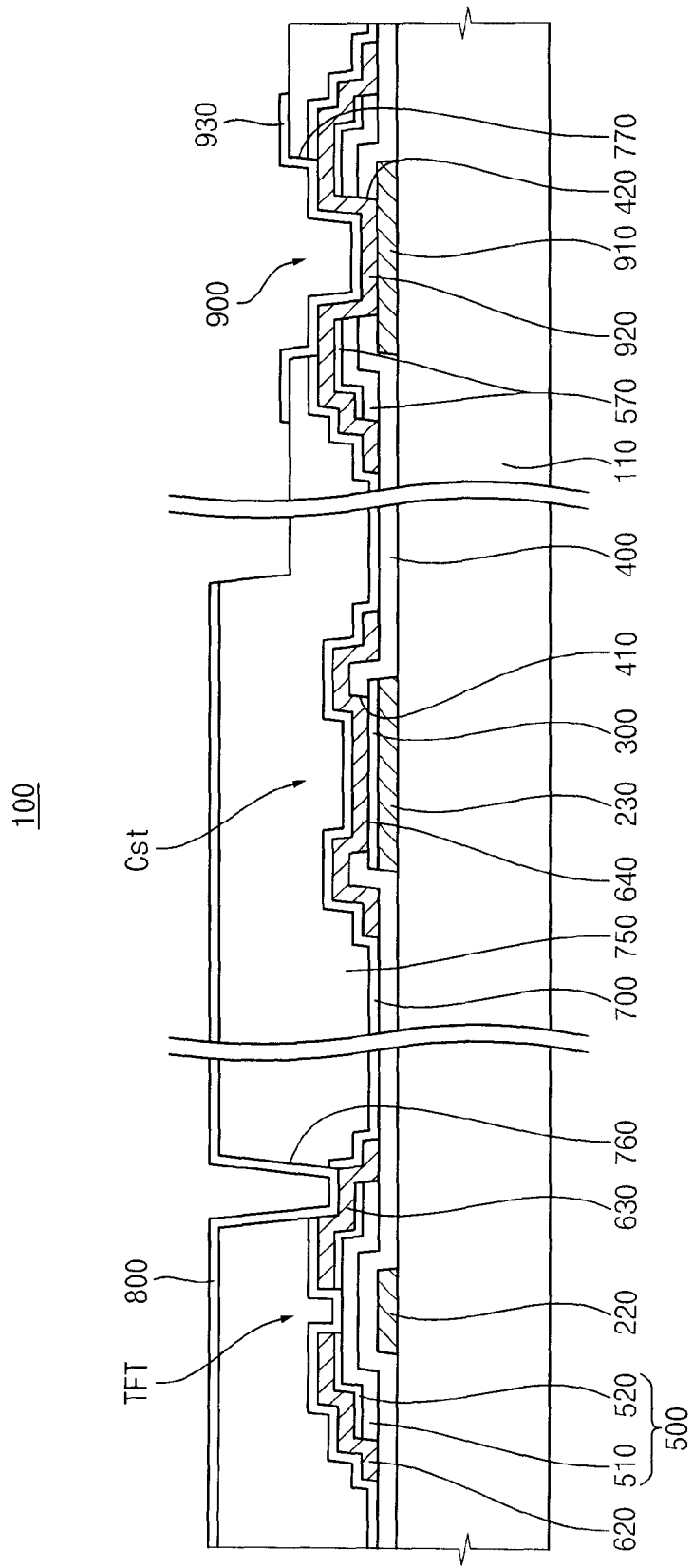
FIG. 2 is a cross-sectional view showing the TFT section, the storage capacitor section, and the pad section of FIG. 1.

FIG. 1 is a layout showing a portion of a thin-film transistor (TFT) substrate according to an exemplary embodiment of the present invention, and FIG. 2 is a cross-sectional view showing the TFT section, the storage capacitor section, and the pad section of FIG. 1.

Referring to FIG. 1 and FIG. 2, a TFT substrate 100 includes a gate wiring 200, a capacitor dielectric layer 300, a gate insulation layer 400, an active layer 500, and a data wiring 600.

The gate wiring 200 is formed on a substrate 110. The gate wiring 200 includes a gate line 210, a gate electrode 220, and a lower storage electrode 230.

The substrate 110 may include a transparent and dielectric material, for example, glass or plastic.

The gate wiring 200 may include, for example, aluminum (Al), molybdenum (Mo), neodymium (Nd), chromium (Cr), tantalum (Ta), titanium (Ti), tungsten (W), copper (Cu), silver (Ag), or an alloy thereof. These may be used alone or in combination. The gate wiring 200 may include more than one layer having different physical and chemical characteristics. For example, the gate wiring 200 may have a two-layer structure of aluminum (Al) and molybdenum (Mo) to reduce electric resistance.

The gate lines 210 may extend, for example, along a horizontal direction, when viewed on a plane, to define lower and upper portions of pixel P.

The gate electrode 220 is connected to the gate line 210. The gate electrode 220 defines a gate terminal of a TFT section TFT formed in the pixel P.

The lower storage electrode 230 is isolated from the gate line 210 and the gate electrode 220. In other words, the lower storage electrode 230 is insulated from the gate line 210 and the gate electrode 220. The lower storage electrode 230 defines a lower electrode of a storage capacitor section Cst. The lower storage electrode 230 overlaps an upper storage electrode 640. The lower storage electrode 230 may partially overlap a data line 610 to increase the capacitance of the storage capacitor section Cst. The lower storage electrode 230 receives a reference voltage.

The capacitor dielectric layer 300 is formed on the lower storage electrode 230. The capacitor dielectric layer 300 separates the lower storage electrode 230 from the upper storage electrode 640 so that the lower and upper storage electrodes 230 and 640 may define the storage capacitor section Cst.

In order to increase the capacitance of the storage capacitor section Cst, the capacitor dielectric layer 300 includes silicon oxide ($SiO_2$) having a higher dielectric constant than silicon nitride ($SiN_x$). Additionally, the capacitor dielectric layer 300 may have a thickness of no more than about 1,000 Å to increase the capacitance of the storage capacitor section Cst. For example, the capacitor dielectric layer 300 may have a thickness of about 500 Å to about 1,000 Å.

The gate insulation layer 400 is formed on the substrate 110 having the gate wiring 200 and the capacitor dielectric layer 300 formed thereon. The gate insulation layer 400 protects and insulates the gate wiring 200 from other conductors. The gate insulation layer 400 may include, for example, $SiN_x$. The gate insulation layer 400 may be thicker than the capacitor dielectric layer 300. For example, the gate insulation layer 400 may have a thickness of about 4,000 Å to about 4,500 Å.

The gate insulation layer 400 has a first contact hole 410 exposing a portion of the capacitor dielectric layer 300.

The active layer 500 is formed on the gate insulation layer 400 to cover the gate electrode 220. The active layer 500 includes a semiconductor layer 510 and an ohmic contact layer 520. The active layer 500 may include, for example, amorphous silicon (a-Si), and the ohmic contact layer 520 may include, for example, amorphous silicon (n+a-Si) having an n-type dopant doped therein in a high concentration.

The data wiring 600 is formed on the gate insulation layer 400 having the active layer 500 formed thereon. The data wiring 600 includes the data line 610, a source electrode 620, a drain electrode 630, and the upper storage electrode 640.

The data wiring 600 may include, for example, aluminum (Al), molybdenum (Mo), neodymium (Nd), chromium (Cr), tantalum (Ta), titanium (Ti), tungsten (W), copper (Cu), silver (Ag), and an alloy thereof. The data wiring 600 may have more than one layer having different characteristics. For example, the data wiring 600 may have a three-layer structure of molybdenum (Mo), aluminum (Al), and molybdenum (Mo) stacked in that order.

The data line 610 extends along a direction that crosses the direction of the gate lines 210. The data line 610 may extend along a vertical direction, when viewed on a plane, to define left and right portions of the pixel P.

The source and drain electrodes 620 and 630 are formed on the active layer 500 such that the source and drain electrodes 620 and 630 are spaced apart from each other. The source electrode 620 is connected to the data line 610, to define a source terminal of the TFT section TFT. The drain electrode 630 is spaced apart from the source electrode 620 to define a drain terminal of the TFT section TFT.

The upper storage electrode 640 is connected to the drain electrode 630 of the TFT section TFT. The upper storage electrode 640 overlaps the lower storage electrode 230. A center portion of the upper storage electrode 640 is disposed on the capacitor dielectric layer 300, which is exposed through the first contact hole 410 of the gate insulation layer 400.

As described above, the storage capacitor section Cst has an increased capacitance because the capacitor dielectric layer 300, which may include $SiO_2$ having lower dielectric constant than $SiN_x$ that may be included in the gate insulation layer 400 and which may be thinner than the gate insulation layer 400, is disposed between the lower and upper storage electrodes 230 and 640, so that capacitance of the storage capacitor section Cst may be increased. If the capacitance is increased, the area of the storage capacitor section Cst may be reduced, so that the aperture ratio may be enhanced.

The TFT substrate 100 may further include a protection layer 700 formed on the substrate 110 having the data wiring 600 formed thereon. The protection layer 700 protects and insulates the TFT section TFT and the storage capacitor section Cst. The protection layer 700 may include, for example, $SiN_x$, and may have a thickness of about 1,500 Å to about 2,000 Å.

The TFT substrate 100 may further include an organic layer 750 formed on the protection layer 700. The organic layer 750 planarizes a surface of the TFT substrate 100.

The TFT substrate 100 may further include a pixel electrode 800 formed on the protection layer 700 or the organic layer 750 in each pixel P. The pixel electrode 800 includes a transparent and conductive material, through which light can be transmitted. The pixel electrode 800 may include, for example, indium tin oxide (ITO), indium zinc oxide (IZO), etc.

The pixel electrode 800 is connected to the drain electrode 630 through a third contact hole 760 formed through the protection layer 700 and the organic layer 750.

The TFT section TFT applies a data voltage, which is transferred through the data line 610, to the pixel electrode 800 when the TFT section TFT receives a gate voltage through the gate wiring 210. The storage capacitor section Cst maintains the data voltage of the pixel electrode 800 during one frame.

The TFT substrate 100 may further include a pad section 900 through which a driver chip (not shown) for driving the TFT substrate 100 is connected to the TFT substrate 100.

The pad section 900 includes a gate metal pad 910 and a data metal pad 920. The gate metal pad 910 may be formed from the same layer as the gate wiring 200, and the data metal pad 920 may be formed from the same layer as the data wiring 600. The pad section 900 may further include a dummy active layer 570 formed from the same layer as the active layer 500.

The data metal pad 920 may be directly connected to the gate metal pad 910 through a second contact hole 420 formed through the gate insulation layer 400 and the dummy active layer 570. When the data metal pad 920 is directly connected to the gate metal pad 910, connection reliability may be enhanced.

The pad section 900 may further include a pad electrode 930 formed from the same layer as the pixel electrode 800. The pad electrode 930 is connected to the data metal pad 920 through a fourth contact hole 770 formed through the protection layer 700 and the organic layer 750.

Hereinafter, a method of manufacturing the TFT substrate in FIG. 1 and FIG. 2 will be explained.

FIG. 3, FIG. 4, FIG. 5, FIG. 6, FIG. 7, FIG. 8, FIG. 9, FIG. 10, FIG. 11, FIG. 12, FIG. 13, FIG. 14, and FIG. 15 are cross-sectional views showing a method of manufacturing the TFT substrate in FIG. 2.

In FIG. 2, the gate wiring 200 including the gate electrode 220 and the lower storage electrode 230, and the capacitor dielectric layer 300 disposed on the lower storage electrode 230 may be simultaneously formed through one mask process.

FIG. 3, FIG. 4, FIG. 5, FIG. 6, and FIG. 7 are cross-sectional views showing a process of manufacturing the gate wiring and the capacitor dielectric layer.

Figure 3:
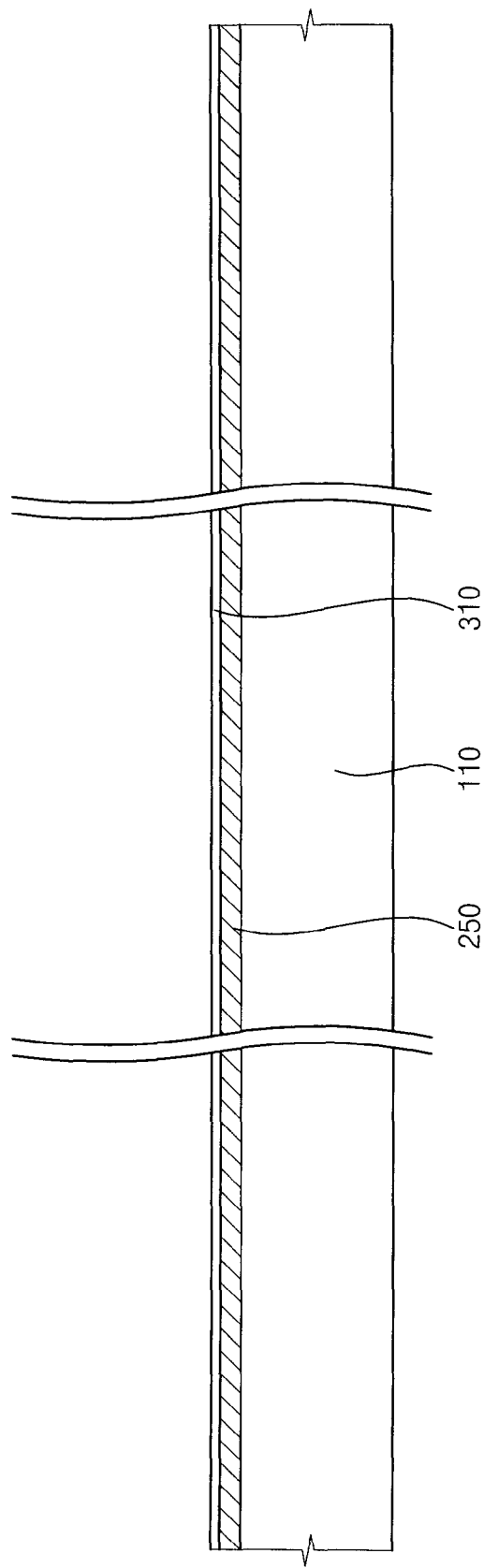
FIG. 3, FIG. 4, FIG. 5, FIG. 6, FIG. 7, FIG. 8, FIG. 9, FIG. 10, FIG. 11, FIG. 12, FIG. 13, FIG. 14, and FIG. 15 are cross-sectional views showing a method of manufacturing the TFT substrate in FIG. 2.

Referring to FIG. 2 and FIG. 3, a gate metal layer 250 and a preliminary capacitor dielectric layer 310 are sequentially formed on the substrate 110. For example, the gate metal layer 250 may be formed through a sputtering process, and the preliminary capacitor dielectric layer 310 may be formed through a chemical vapor deposition (CVD) process.

The gate metal layer 250 may include, for example, aluminum (Al), molybdenum (Mo), neodymium (Nd), chromium (Cr), tantalum (Ta), titanium (Ti), tungsten (W), copper (Cu), silver (Ag), or an alloy thereof. These may be used alone or in combination. The gate metal layer 250 may include two or more layers having different physical and chemical characteristics. For example, the gate metal layer 250 may have a two-layer structure of aluminum (Al) and molybdenum (Mo) to reduce electric resistance.

The preliminary capacitor dielectric layer 310 may include, for example, $SiO_2$ and may have a thickness of about 500 Å to about 1,000 Å.

Figure 4:
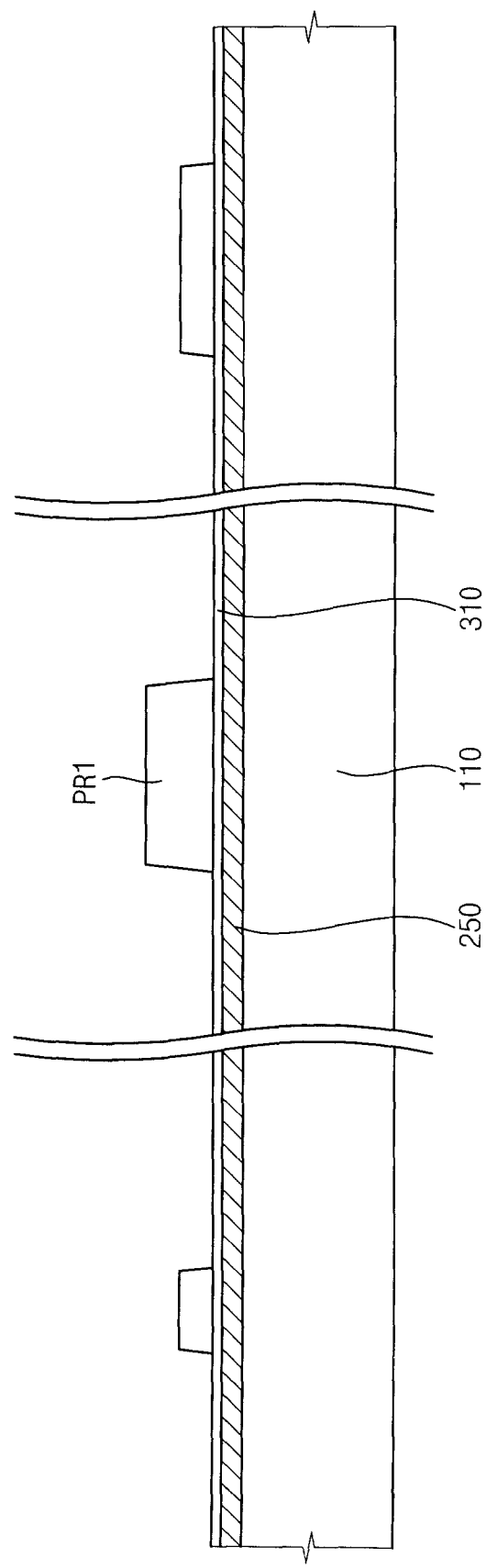

Referring to FIG. 2 and FIG. 4, a first photoresist pattern PR1 is formed on the preliminary capacitor dielectric layer 310. The first photoresist pattern PR1 may be formed such that the first photoresist pattern PR1 in a capacitor dielectric layer region is thicker than the first photoresist pattern PR1 in a gate electrode region. The different thicknesses of the first photoresist pattern PR1 may be obtained by one process through a slit mask or a half-tone mask.

The first photoresist pattern PR1 is also formed in a gate metal pad region. The first photoresist pattern PR1 in the gate metal pad region may have substantially the same thickness as that of the first photoresist pattern PR1 in the gate electrode region.

Figure 5:
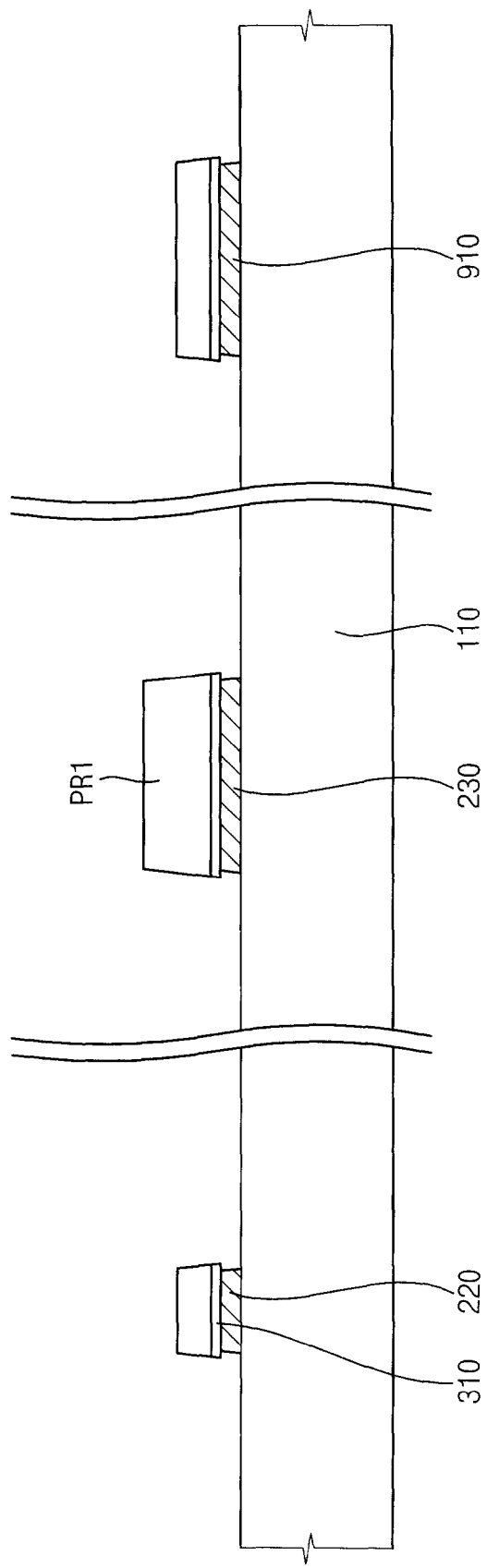

Referring to FIG. 4 and FIG. 5, the preliminary capacitor dielectric layer 310 and the gate metal layer 250 are patterned using the first photoresist pattern PR1 to form the gate wiring 200 including the gate electrode 220 and the lower storage electrode 230, and the gate metal pad 910.

Figure 6:
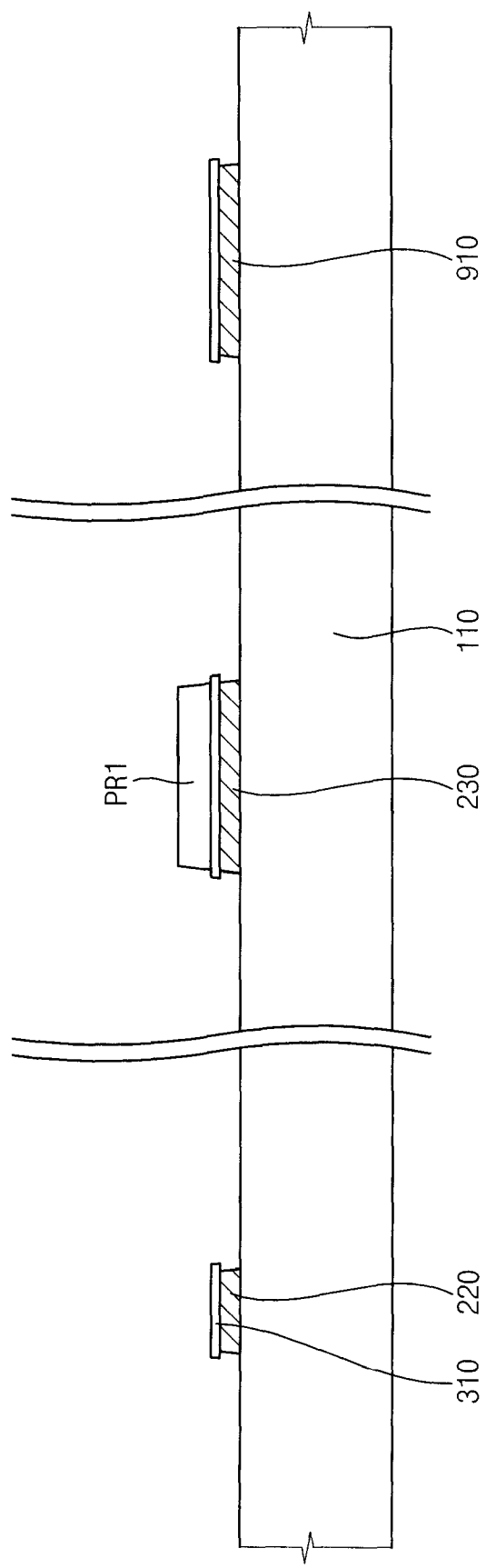

Referring to FIG. 6, an etch-back process may be performed to reduce the thickness of the first photoresist pattern PR1 by a predetermined thickness. As a result, the first photoresist patterns PR1 in the gate electrode region and the gate metal pad region are removed, and the thinner first photoresist pattern PR1 in the lower storage electrode region remains.

Figure 7:
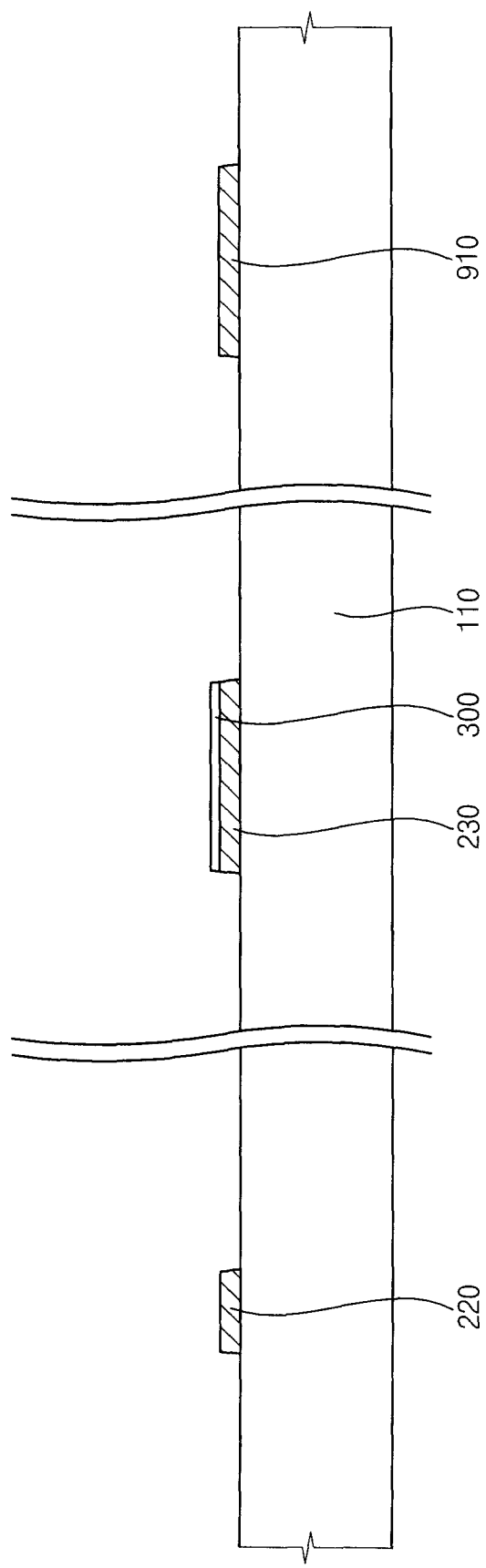

Referring to FIG. 6 and FIG. 7, the preliminary capacitor dielectric layer 310 is patterned using the thinner first photoresist pattern PR1 in the lower storage electrode region. Then, the preliminary capacitor dielectric layer 310 in the gate electrode layer region and the gate metal pad region is removed, and the preliminary capacitor dielectric layer 310 in the lower storage electrode region remains to form the capacitor dielectric layer 300.

Then, the first photoresist pattern PR1 remaining on the capacitor dielectric layer 300 is removed.

As described above, when the gate wiring 200 including the gate electrode 220 and the lower storage electrode 230, and the capacitor dielectric layer 300 are simultaneously formed through the same patterning process using one mask, the capacitor dielectric layer 300 may be self-aligned on the lower storage electrode 230. When the gate metal layer 250 is patterned, an undercut of the gate metal layer 250 is generated under the capacitor dielectric layer 300. However, when the preliminary capacitor dielectric layer 310 is patterned, a side of the preliminary capacitor layer 310 may be etched so that the area of the capacitor dielectric layer 300 becomes no larger than the area of the lower storage electrode 230.

Then, the gate insulation layer 400 and the active layer 500 are formed on the substrate 110 having the gate wiring 200, the capacitor dielectric layer 300 and the gate metal pad 910 formed thereon.

Figure 8:
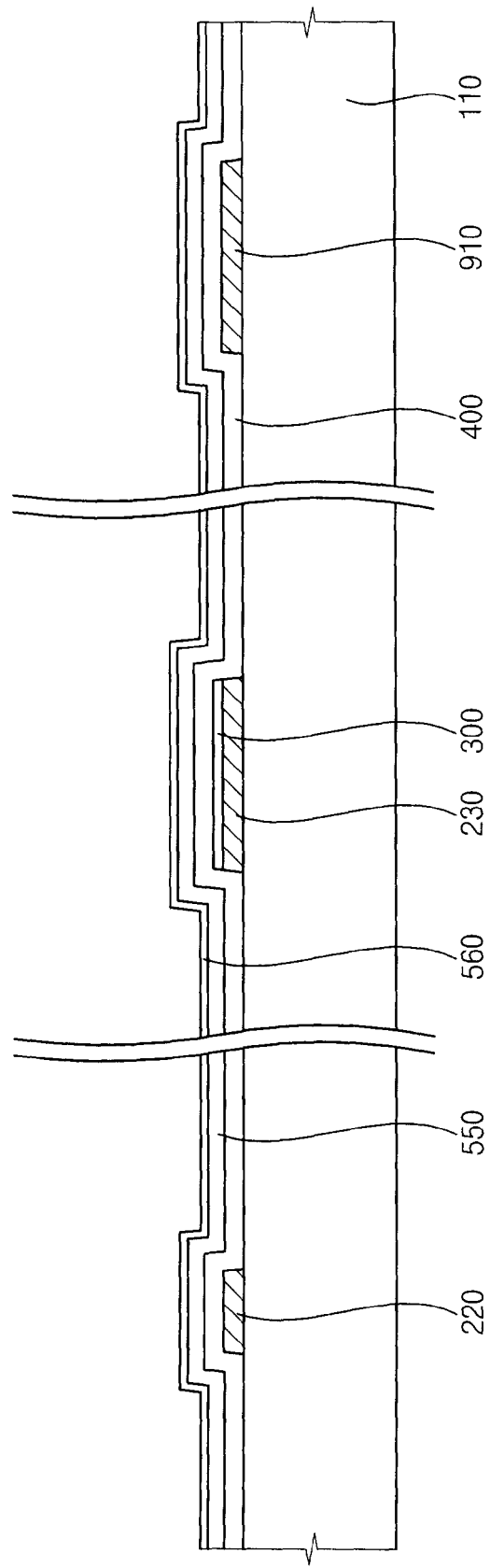
Figure 9:
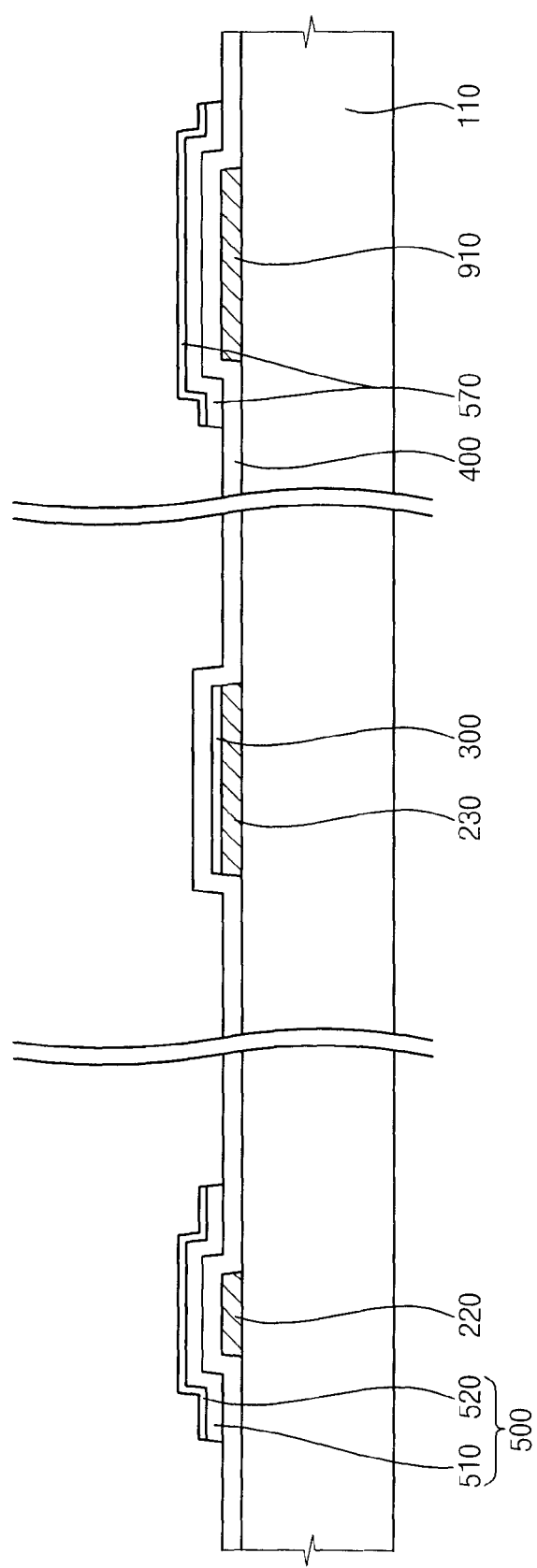
Figure 10:
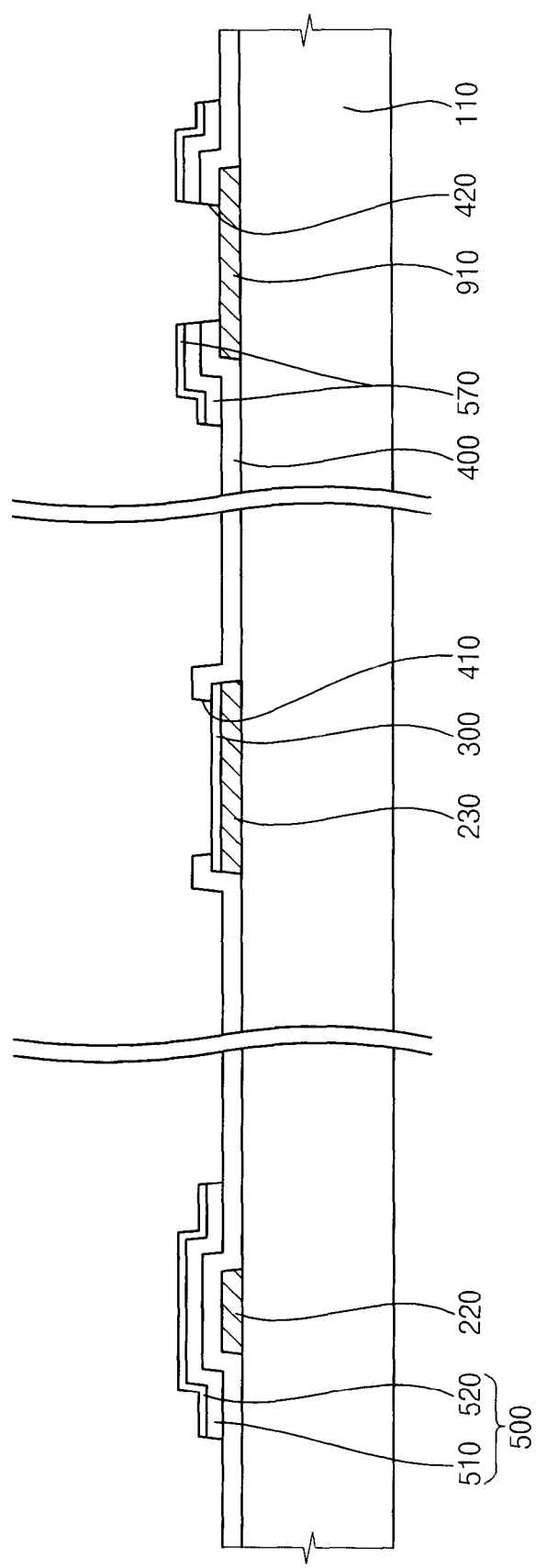

FIG. 8, FIG. 9, and FIG. 10 are cross-sectional views showing a process of forming the gate insulation layer and the active layer.

Referring to FIG. 8, the gate insulation layer 400, a preliminary semiconductor layer 550 including amorphous silicon (a-Si), and a preliminary ohmic contact layer 560 including amorphous silicon (n+a-Si) having an n-type dopant doped therein are sequentially formed on the substrate 110 having the gate wiring 200, the capacitor dielectric layer 300, and the gate metal pad 910 formed thereon. The gate insulation layer 400, the preliminary semiconductor layer 550, and the preliminary ohmic contact layer 560 may be formed through, for example, a CVD method.

Referring to FIG. 8 and FIG. 9, the preliminary semiconductor layer 550 and the preliminary ohmic contact layer 560 are simultaneously patterned to form the active layer 500 disposed on the gate insulation layer 400 in the gate electrode region. The dummy active layer 570 may be formed on the gate insulation layer 400 in the gate metal pad region through a process of forming the active layer 500.

Referring to FIG. 10, the first contact hole 410 is formed through the gate insulation layer 400. The first contact hole 410 is formed in the capacitor dielectric layer region to expose the capacitor dielectric layer 300. The second contact hole 420 is formed through the gate insulation layer 400 and the dummy active layer 570 in the gate metal pad region through a process of forming the first contact hole 410.

The gate insulation layer 400, the active layer 500, and the dummy active layer 570 having the first and second contact holes 410 and 420 may be formed through processes using two masks. However, the gate insulation layer 400, the active layer 500, and the dummy active layer 570 having the first and second contact holes 410 and 420 may be formed through a process using one mask.

Figure 11:
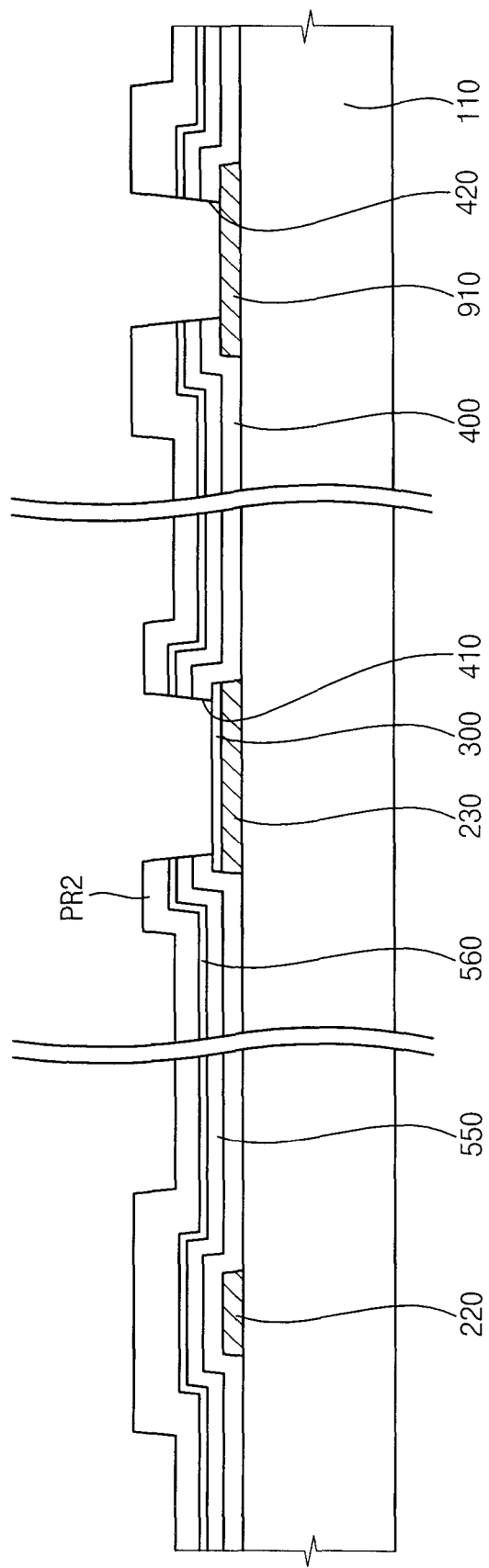
Figure 12:
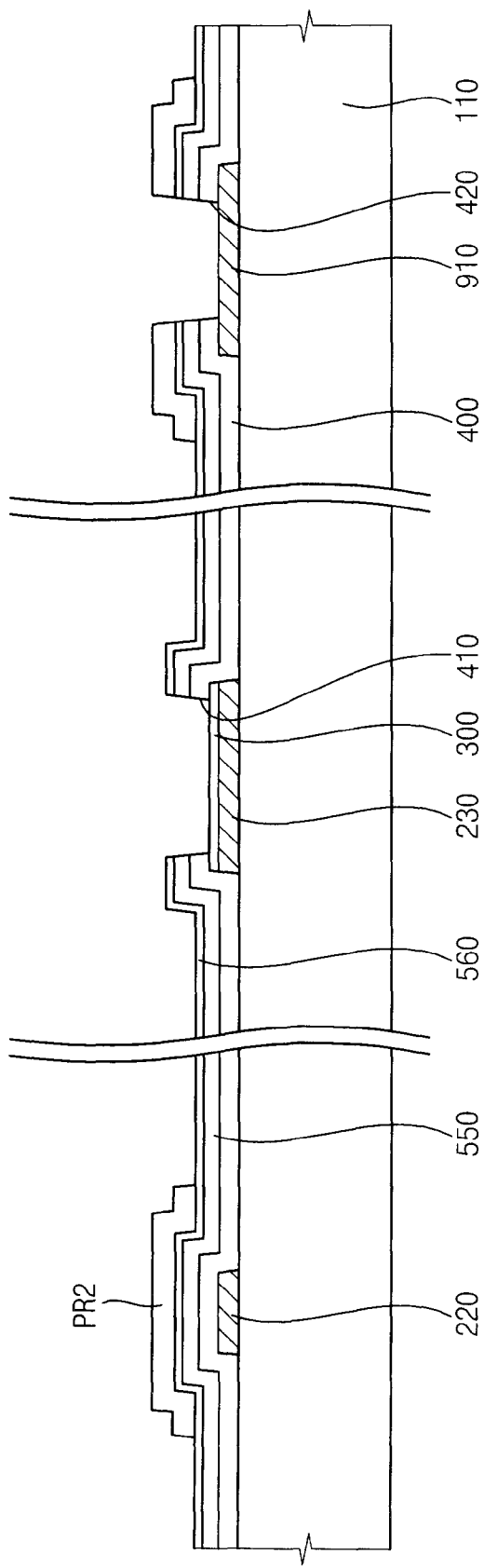
Figure 13:
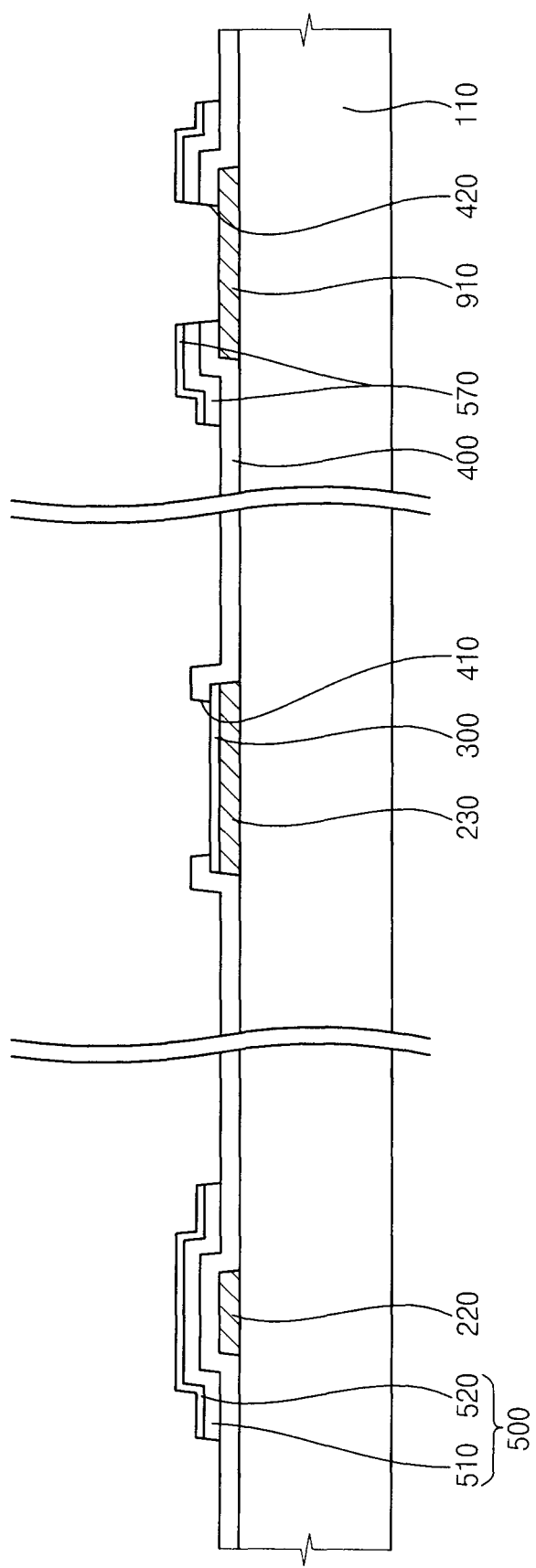

FIG. 11, FIG. 12, and FIG. 13 are cross-sectional views showing a process of manufacturing the gate insulation layer and the active pattern according to another exemplary embodiment of the present invention.

Referring to FIG. 2 and FIG. 11, a second photoresist pattern PR2 is formed on the substrate 110 having the gate insulation layer 400, the preliminary semiconductor layer 550, and the preliminary ohmic contact layer 560 sequentially formed thereon as shown in FIG. 8.

The second photoresist pattern PR2 is formed such that the second photoresist pattern PR2 is opened in the capacitor dielectric layer region and has an increased thickness in the active layer region. Additionally, the second photoresist pattern PR2 is opened in the gate metal pad region. The second photoresist pattern PR2 may be formed such that the second photoresist pattern PR2 is relatively thicker in the dummy active layer region like in the active layer region. The second photoresist pattern PR2 having a different thickness may be formed through one process using a slit mask or a half-tone mask.

Then, the preliminary ohmic contact layer 560, the preliminary semiconductor layer 550 and the gate insulation layer 400 in the capacitor dielectric layer region are patterned using the second photoresist pattern PR2. The preliminary ohmic contact layer 560, the preliminary semiconductor layer 550 and the gate insulation layer 400 in the gate metal pad region may be simultaneously patterned. As a result, the first contact hole 410 exposing the capacitor dielectric layer and the second contact hole 420 exposing the gate metal pad 910 are formed through the gate insulation layer 400.

Referring to FIG. 11 and FIG. 12, an etch-back process may be performed to reduce the thickness of the second photoresist pattern PR2 by a predetermined thickness. Then, the second photoresist pattern PR2 having a reduced thickness remains only in the active layer region and the dummy active layer region, and the second photoresist pattern PR2 in the remaining regions is removed.

Referring to FIG. 12 and FIG. 13, the preliminary ohmic contact layer 560 and the preliminary semiconductor layer 550 are patterned using the second photoresist pattern PR2 having a reduced thickness through the etch-back process. As a result, the preliminary ohmic contact layer 560 and the preliminary semiconductor layer 550 remain only in the active layer region and the dummy active layer region to form the active layer 500 and the dummy active layer 570.

Then, the second photoresist pattern PR2 having a reduced thickness is removed.

As described above, when the process of forming the active layer 500 and the dummy active layer 570 and the process of forming the first and second contact holes 410 and 420 through the gate insulation layer 400 are simultaneously performed using one mask, manufacturing costs may be reduced and productivity may be enhanced.

Figure 14:
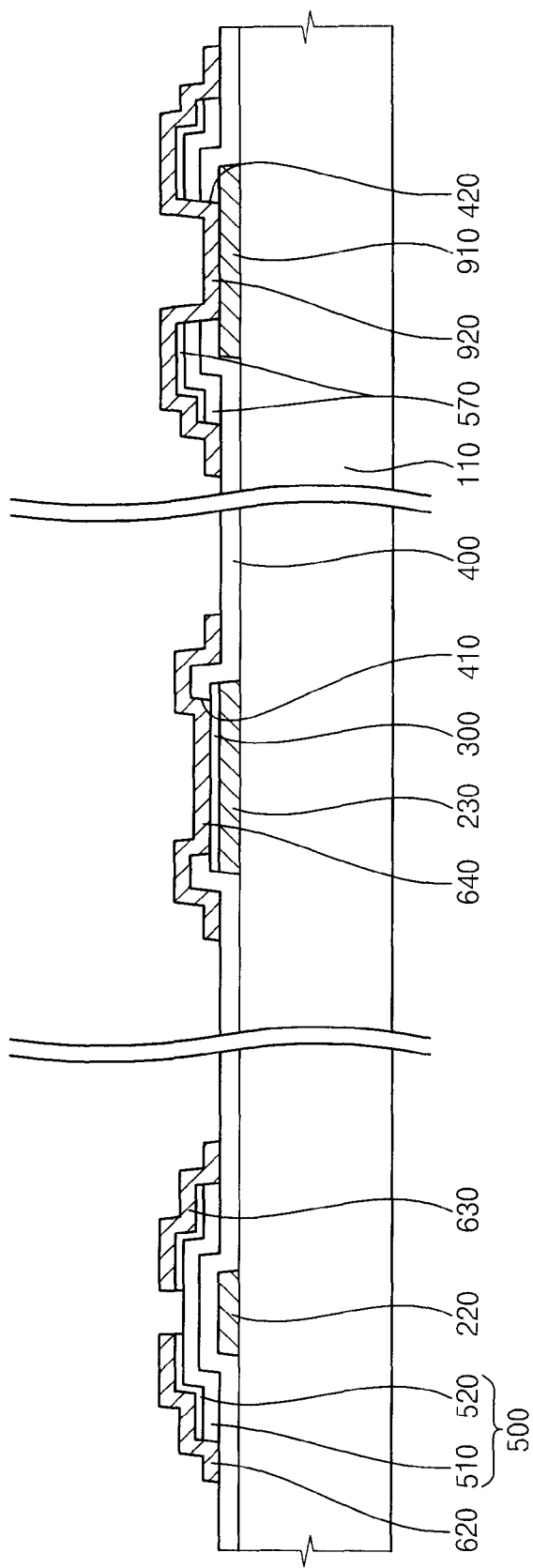

Referring to FIG. 14, the data wiring 600 including the source electrode 620, the drain electrode 630, and the upper storage electrode 640 is formed on the substrate 110 having the gate insulation layer 400 and the active layer 500 formed thereon.

The source and drain electrodes 620 and 630 are disposed on the active layer 500 such that the source and drain electrodes 620 and 630 are spaced apart from each other. A portion of the upper storage electrode 640 is disposed on the capacitor dielectric layer 300 exposed through the first contact hole 410 formed through the gate insulation layer 400.

The data metal pad 920 is formed through a process of forming the data wiring 600. The data metal pad 920 may be directly connected to the gate metal pad 910 through the second contact hole 420 formed through the gate insulation layer 400 and the dummy active layer 570.

Figure 15:
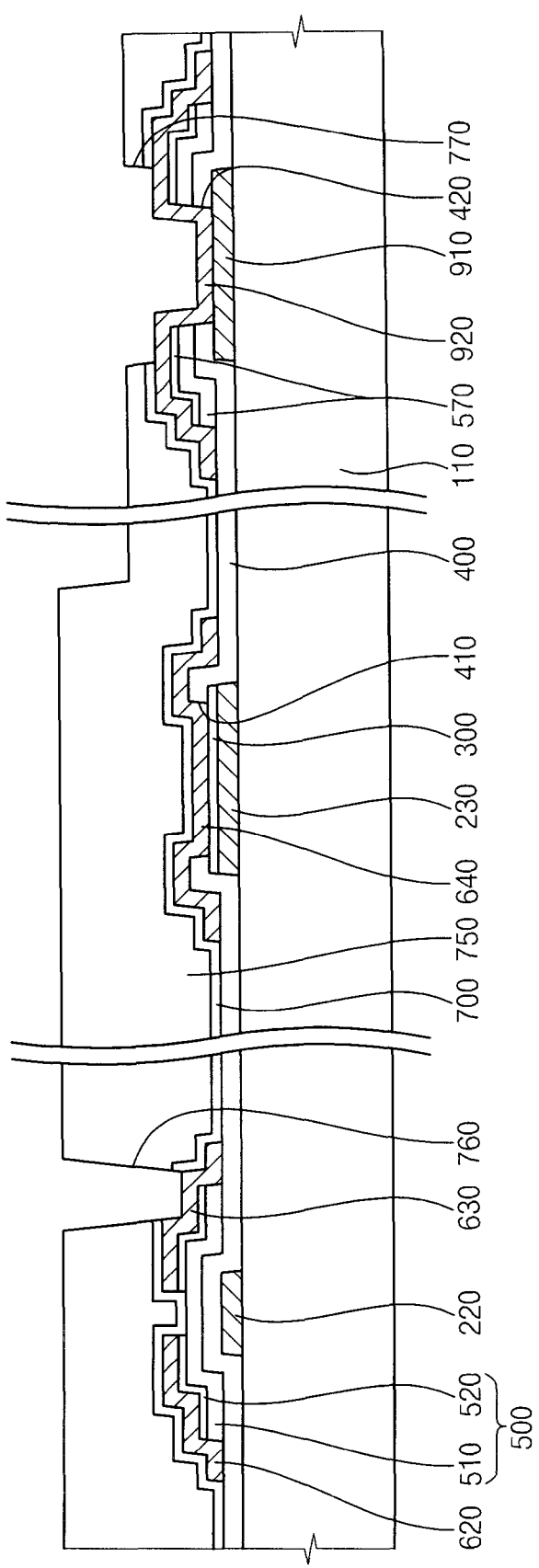

Referring to FIG. 15, the protection layer 700 is formed on the substrate 110 having the data wiring 600 formed thereon. The protection layer 700 protects and insulates the data wiring 600. The protection layer 700 may include, for example, $SiN_x$.

The organic layer 750 may be formed on the protection layer 700 to planarize a surface of the TFT substrate 100.

Then, the third contact hole 760 exposing a portion of the drain electrode 630 is formed through the protection layer 700 and the organic layer 750 through a process using a mask process. Additionally, the fourth contact hole 770 exposing the data metal pad 920 is formed through a process of forming the third contact hole 760.

Referring again to FIG. 2, the pixel electrode 800 is formed on the organic layer 750. The pixel electrode 800 is connected to the drain electrode 630 via the third contact hole 760 formed through the protection layer 700 and the organic layer 750.

Additionally, the pad electrode 930 may be formed through the process of forming the pixel electrode 800. The pad electrode 930 is connected to the data metal pad 920 through the fourth contact hole 770 formed through the protection layer 700 and the organic layer 750.

When the organic layer 750 is not formed, the pixel electrode 800 and the pad electrode 930 are formed on the protection layer 700.

According to the TFT substrate and the method of manufacturing the TFT substrate described above, a capacitor dielectric layer including silicon oxide and being relatively thin is disposed between lower and upper storage electrodes defining a storage capacitor section, so that the capacitance of the storage capacitor section may be enhanced without deteriorating TFT characteristics. Furthermore, the area of the storage capacitor section may be reduced by as much as the capacitance of the storage capacitor section is increased to enhance the aperture ratio.

Additionally, when a contact hole for connecting the data metal pad to the gate metal pad is formed through the gate insulation layer, the gate insulation layer in the capacitor dielectric layer region may be removed, so that no additional process may be required, thereby reducing manufacturing costs and enhancing productivity.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin-film transistor (TFT) substrate, comprising:
    a gate wiring disposed on a substrate, the gate wiring comprising a gate electrode, a lower storage electrode, and a gate metal pad;
    a capacitor dielectric layer disposed on the lower storage electrode;
    a gate insulation layer disposed on the substrate;
    an active pattern including an active layer and a dummy active layer disposed on the gate insulation layer in a gate electrode region and a gate metal pad region, respectively;
    a data wiring comprising a source electrode, a drain electrode, an upper storage electrode, and a data metal pad, the source and drain electrodes being disposed on the active layer such that the source and drain electrodes are spaced apart from each other, a portion of the upper storage electrode being disposed on the capacitor dielectric layer exposed through a first contact hole in the gate insulation layer, the data metal pad being directly connected to the gate metal pad through a second contact hole in the gate insulation layer and the dummy active layer;
    a protection layer disposed on the substrate; and
    a pixel electrode disposed on the protection layer, the pixel electrode being connected to the drain electrode.

2. The TFT substrate of claim 1, wherein the capacitor dielectric layer comprises silicon oxide ($SiO_2$).

3. The TFT substrate of claim 2, wherein the capacitor dielectric layer has a thickness of about 500 Å to about 1,000 Å.

4. The TFT substrate of claim 1, further comprising an organic layer disposed between the protection layer and the pixel electrode.

5. The TFT substrate of claim 1, further comprising a pad electrode formed from a same layer as the pixel electrode, the pad electrode being directly connected to the data metal pad.

* * * * *